(12) United States Patent
Kim et al.

(10) Patent No.: US 6,205,564 B1
(45) Date of Patent: Mar. 20, 2001

(54) OPTIMIZED BUILT-IN SELF-TEST METHOD AND APPARATUS FOR RANDOM ACCESS MEMORIES

(75) Inventors: Ilyoung Kim, Middlesex; Yervant Zorian, Somerset, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 08/867,351

(22) Filed: Jun. 2, 1997

(51) Int. Cl.[7] .................................................. G06F 11/00
(52) U.S. Cl. .................................................. 714/48
(58) Field of Search ..................... 395/183.18, 183.01, 395/183, 183.08, 183.16, 185.07; 371/21.1, 21.2, 21.3, 21.6

(56) References Cited

U.S. PATENT DOCUMENTS

| | | | |
|---|---|---|---|
| H1741 | * 7/1998 | Cruts | 371/21.3 |
| 5,113,399 | * 5/1992 | Woods et al. | 371/21.3 |
| 5,325,367 | * 6/1994 | Dekker et al. | 371/21.1 |
| 5,471,482 | * 11/1995 | Byers et al. | 371/21.2 |
| 5,513,318 | 4/1996 | van de Goor et al. | 395/185.01 |
| 5,661,730 | * 8/1997 | Mitra et al. | 371/21.3 |

OTHER PUBLICATIONS

A.J. van de Goor, *Testing Semicondutor Memories*, Chapter 12. bulti–in self–test, pp. 339–423, John wiley & sons (1991).

Mikitjuk et al., "RAM Testing Algorithms for Detection Multiple Linked Faults," IEEE 1996 Proceedings European Design & Test Conference, pp. 435–439 (Mar. 1996).

Cockburn, B.F., "Tutorial on Semiconductor Memory Testing," *Journal of Electronic Testing*, vol. 5, pp. 531–336 (1994).

Cockburn et al., "Near–Optimal Tests for Classes of Write–Triggered Coupling Faults in RAMs," *Journal of Electronic Testing*, vol. 3, pp. 251–264 (1992).

Dekker et al., "A Realistic Fault Model and Test Algorithms for Static Random Access Memories," *IEEE Transactions on Computer–Aided Design*, vol. 9, No. 6, pp. 567–572 (Jun. 1990).

* cited by examiner

*Primary Examiner*—Robert W. Beausoliel, Jr.
*Assistant Examiner*—Pierre E. Elisca

(57) ABSTRACT

A method and apparatus are described for detecting an optimized set of predetermined faults in a memory device which ensure an acceptable quality level. The method and apparatus comprise a BIST March algorithm optimized to accelerate the testing time by reducing the number of read/write operations necessary to detect a set of predetermined faults.

37 Claims, 9 Drawing Sheets

FIG. 1
PRIOR ART

| TEST | DETECTED FAULTS | | | | | | | | | | | |
|---|---|---|---|---|---|---|---|---|---|---|---|---|
| | AF | SAF | TF | CF$_{in}$ | CF$_{id}$ | TF-CF | CF$_{id}$-CF$_{id}$ | CF$_{in}$-CF$_{in}$ | CF$_{in}$-CF$_{id}$ | SOF | RF | CF$_{st}$ |
| MATS + | • | • | | | | | | | | | | |
| MARCH C- | • | • | • | • | • | | | | | | | |
| MARCH A | • | • | • | • | • | | • | | | | | |
| MARCH M | • | • | • | • | • | • | • | • | • | | | |

FIG. 2

| TEST | DESCRIPTION OF ALGORITHM | LENGTH COMPONENT OF TESTING TIME | DETECTED FAULTS ||||||||| 
| | | | F1-AF | F2-SAF | F3-TF | F4-CFid | F5-TF-CF | F6-CFid-CFid | F7-SOF | F8-RF | F9-CFst |
| --- | --- | --- | --- | --- | --- | --- | --- | --- | --- | --- | --- |
| THE MARCH YZ ALGORITHM 150 (TECHNOLOGY DEPENDENT) | ⇕(W$^x$); ⇑(R$^x$,W$^y$,R$^y$,W$^x$); ⇑(R$^x$,W$^y$); ⇓(R$^y$,W$^x$,R$^x$,W$^y$); ⇕(R$^y$); ⇓(R$^y$,W$^x$) | $14n$ | • | • | • | • | • | • | • | • | • |
| THE MARCH YZ ALGORITHM 151 (TECHNOLOGY INDEPENDENT) | ⇕(W$^x$); ⇑(R$^x$,W$^y$,R$^y$,W$^x$); ⇑(R$^x$,W$^y$); ⇓(R$^y$,W$^x$,R$^x$,W$^y$); ⇕(R$^y$); ⇓(R$^y$,W$^x$) | $14n * (\log_2 m + 1)$ | • | • | • | • | • | • | • | • | • |
| THE MARCH YZ ALGORITHM 152 | ⇕(W$^x$); ⇑(R$^x$,W$^y$,R$^y$,W$^x$); ⇑(R$^x$,W$^y$); ⇓(R$^y$,W$^x$,R$^x$,W$^y$); ⇕(R$^y$); ⇓(R$^y$,W$^x$) | $14n$ | • | • | • | • | • | • | • | • | |
| THE MARCH YZ ALGORITHM 153 | ⇕(W$^x$); ⇑(R$^x$,W$^y$,R$^y$,W$^x$); ⇑(R$^x$,W$^y$); ⇓(R$^y$,W$^x$,R$^x$,W$^y$); ⇕(R$^y$); ⇓(R$^y$,W$^x$) | $14n$ | • | • | • | • | • | • | • | | |

FIG. 3

THE PRESENT INVENTION BASE
BIST MARCH YZ ALGORITHM 150

| SEQ. | ADD. ORD. | Step | Description |
|---|---|---|---|
| I | ⇔ | (1) | $W^x$ |
| II | ⇒ | (2) | $R^x$ |
|  |  | (3) | $W^y$ |
|  |  | (4) | $R^y$ |
|  |  | (5) | $W^x$ |
| III | ⇒ | (6) | $R^x$ |
|  |  | (7) | $W^y$ |
| IV | ⇒ | (8) | $R^y$ |
|  |  | (9) | $W^x$ |
|  |  | (10) | $R^x$ |
|  |  | (11) | $W^y$ |
| V | ⇔ | (12) | $R^y$ |
| VI | ⇐ | (13) | $R^y$ |
|  |  | (14) | $W^x$ |

FIG. 4
PRIOR ART

THE PRIOR ART
BIST MARCH M ALGORITHM

| SEQ. | ADD. ORD. | Step | Description |
|---|---|---|---|
| I | ⇔ | (1) | $w^0$ |
| II | ⇒ | (2) | $r^0$ |
|  |  | (3) | $w^1$ |
|  |  | (4) | $r^1$ |
|  |  | (5) | $w^0$ |
| III | ⇔ | (6) | $r^0$ |
| IV | ⇒ | (7) | $r^0$ |
|  |  | (8) | $w^1$ |
| V | ⇔ | (9) | $r^1$ |
| VI | ⇒ | (10) | $r^1$ |
|  |  | (11) | $w^0$ |
|  |  | (12) | $r^0$ |
|  |  | (13) | $w^1$ |
| VII | ⇔ | (14) | $r^1$ |
| VIII | ⇐ | (15) | $r^1$ |
|  |  | (16) | $w^0$ |

FIG. 5

THE PRESENT INVENTION BIST MARCH YZ ALGORITHM 151

| SEQ. | ADD. ORD. | Step | Description |
|---|---|---|---|
| I | $\Leftrightarrow$ | (1) | $W^x$ |
| II | $\Rightarrow$ | (2) | $R^x$ |
|  |  | (3) | $W^y$ |
|  |  | (4) | $R^y$ |
|  |  | (5) | $W^x$ |
| HOLD PERIOD | | | |
| III | $\Rightarrow$ | (6) | $R^x$ |
|  |  | (7) | $W^y$ |
| HOLD PERIOD | | | |
| IV | $\Rightarrow$ | (8) | $R^y$ |
|  |  | (9) | $W^x$ |
|  |  | (10) | $R^x$ |
|  |  | (11) | $W^y$ |
| V | $\Leftrightarrow$ | (12) | $R^y$ |
| VI | $\Leftarrow$ | (13) | $R^y$ |
|  |  | (14) | $W^x$ |
| VII | $\Leftrightarrow$ | (15) | $W^x$ |
| VIII | $\Rightarrow$ | (16) | $R^x$ |
|  |  | (17) | $W^y$ |
|  |  | (18) | $R^y$ |
|  |  | (19) | $W^x$ |
| IX | $\Rightarrow$ | (20) | $R^x$ |
|  |  | (21) | $W^y$ |

| SEQ. | ADD. ORD. | Step | Description |
|---|---|---|---|
| X | $\Rightarrow$ | (22) | $R^y$ |
|  |  | (23) | $W^x$ |
|  |  | (24) | $R^x$ |
|  |  | (25) | $W^y$ |
| XI | $\Leftrightarrow$ | (26) | $R^y$ |
| XII | $\Leftarrow$ | (27) | $R^y$ |
|  |  | (28) | $W^x$ |
| XIII | $\Leftrightarrow$ | (29) | $W^x$ |
| XIV | $\Rightarrow$ | (30) | $R^x$ |
|  |  | (31) | $W^y$ |
|  |  | (32) | $R^y$ |
|  |  | (33) | $W^x$ |
| XV | $\Rightarrow$ | (34) | $R^x$ |
|  |  | (35) | $W^y$ |
| XVI | $\Rightarrow$ | (36) | $R^y$ |
|  |  | (37) | $W^x$ |
|  |  | (38) | $R^x$ |
|  |  | (39) | $W^y$ |
| XVII | $\Leftrightarrow$ | (40) | $R^y$ |
| XVIII | $\Leftarrow$ | (41) | $R^y$ |
|  |  | (42) | $W^x$ |

FIG. 6

THE SYNCHRONOUS RAM 50: IMPLEMENTING THE BIST MARCH YZ ALGORITHM 151

| Line | Operation | No. Of Steps Per Operation |
|------|-----------|----------------------------|
| A. | START | 1 |
| B. | $\Leftrightarrow W^x$ | 1 * Word |
| C. | $\Uparrow R^x W^y R^y W^x$ | 4 * Word |
| D. | HOLD | 1 HP |
| E. | $\Uparrow R^x W^y$ | 2 * Word |
| F. | HOLD | 1 HP |
| G. | $\Uparrow R^y W^x R^x W^y$ | 4 * Word |
| H. | $\Uparrow R^y$ | 1 * Word |
| I. | $\Downarrow R^y W^x$ | 4 * Word |
| J. | START NEXT | 1 |
| K. | $\Uparrow W^x$ | 1 * Word |
| L. | $\Uparrow R^x W^y R^y W^x$ | 4 * Word |
| M. | $\Uparrow R^x W^y$ | 2 * Word |
| N. | $\Uparrow R^y W^x R^x W^y$ | 4 * Word |
| O. | $\Uparrow R^y$ | 1 * Word |
| P. | $\Downarrow R^y W^x$ | 4 * Word |
| Q. | START NEXT | 1 |
| R. | $\Uparrow W^x$ | 1 * Word |
| S. | $\Uparrow R^x W^y R^y W^x$ | 4 * Word |
| T. | $\Uparrow R^x W^y$ | 2 * Word |
| U. | $\Uparrow R^y W^x R^x W^y$ | 4 * Word |
| V. | $\Uparrow R^y$ | 1 * Word |
| W. | $\Downarrow R^y W^x$ | 4 * Word |
| X. | $\Rightarrow WR^{L_y}$ | 2 * m |
| Y. | END | 1 |

FIG. 7

THE ASYNCHRONOUS RAM 50: IMPLEMENTING THE BIST MARCH YZ ALGORITHM 151

| Line | Operation | No. Of Steps Per Operation (commented) | |
|---|---|---|---|
| A. | START | 1 | |
| B. | $\Leftrightarrow W^x$ | 3 * Word | ASU,WE,AH |
| C. | $\Uparrow R^x W^y R^y W^x$ | 7 * Word | ASU,READ+DSU,WE,DH,READ+DSU,WE,AH+DH |
| D. | HOLD | 1 HP | HOLD PERIOD |
| E. | $\Uparrow R^x W^y$ | 4 * Word | ASU,READ+DSU,WE,AH+DH |
| F. | HOLD | 1 HP | HOLD PERIOD |
| G. | $\Uparrow R^y W^x R^x W^y$ | 7 * Word | ASU,READ+DSU,WE,DH,READ+DSU,WE,AH+DH |
| H. | $\Uparrow R^y$ | 2 * Word | ASU,READ |
| I. | $\Downarrow R^y W^x$ | 2 * Word | ASU,READ+DSU,WE,AH+DH |
| J. | START NEXT | 1 | |
| K. | $\Uparrow W^x$ | 3 * Word | ASU,WE,AH |
| L. | $\Uparrow R^x W^y R^y W^x$ | 7 * Word | ASU,READ+DSU,WE,DH,READ+DSU,WE,AH+DH |
| M. | $\Uparrow R^x W^y$ | 4 * Word | ASU,READ+DSU,WE,AH+DH |
| N. | $\Uparrow R^y W^x R^x W^y$ | 7 * Word | ASU,READ+DSU,WE,DH,READ+DSU,WE,AH+DH |
| O. | $\Uparrow R^y$ | 2 * Word | ASU,READ |
| P. | $\Downarrow R^y W^x$ | 2 * Word | ASU,READ+DSU,WE,AH+DH |
| Q. | START NEXT | 1 | |
| R. | $\Uparrow W^x$ | 3 * Word | ASU,WE,AH |
| S. | $\Uparrow R^x W^y R^y W^x$ | 7 * Word | ASU,READ+DSU,WE,DH,READ+DSU,WE,AH+DH |
| T. | $\Uparrow R^x W^y$ | 4 * Word | ASU,READ+DSU,WE,AH+DH |
| U. | $\Uparrow R^y W^x R^x W^y$ | 7 * Word | ASU,READ+DSU,WE,DH,READ+DSU,WE,AH+DH |
| V. | $\Uparrow R^y$ | 2 * Word | ASU,READ |
| W. | $\Downarrow R^y W^x$ | 2 * Word | ASU,READ+DSU,WE,AH+DH |
| X. | $\Rightarrow W R^{Ly}$ | 3 * n | DSU,WE,READ+DH |
| Y. | END | 1 | |

FIG. 8

THE SYNCHRONOUS RAM 50: IMPLEMENTING THE BIST MARCH YZ ALGORITHM 150

| Line | Operation | No. Of Steps Per Operation |
|---|---|---|
| A. | START | 1 |
| B. | $\Leftrightarrow W^x$ | $1 * Word$ |
| C. | $\Uparrow R^x W^y R^y W^x$ | $4 * Word$ |
| D. | HOLD | 1 HP |
| E. | $\Uparrow R^x W^y$ | $2 * Word$ |
| F. | HOLD | 1 HP |
| G. | $\Uparrow R^y W^x R^x W^y$ | $4 * Word$ |
| H. | $\Uparrow R^y$ | $1 * Word$ |
| I. | $\Downarrow R^y W^x$ | $2 * Word$ |
| J. | $\Rightarrow WR^{Ly}$ | $2 * n$ |
| K. | END | 1 |

FIG. 9

THE SYNCHRONOUS RAM 50: IMPLEMENTING THE BIST MARCH YZ ALGORITHM 152

| Line | Operation | No. Of Steps Per Operation |
|---|---|---|
| A. | START | 1 |
| B. | $\Leftrightarrow W^x$ | $1 * Word$ |
| C. | $\Uparrow R^x W^y R^y W^x$ | $4 * Word$ |
| D. | HOLD | 1 HP |
| E. | $\Uparrow R^x W^y$ | $2 * Word$ |
| F. | HOLD | 1 HP |
| G. | $\Uparrow R^y W^x R^x W^y$ | $4 * Word$ |
| H. | $\Uparrow R^y$ | $1 * Word$ |
| I. | $\Downarrow R^y W^x$ | $2 * Word$ |
| J. | $\Rightarrow WR^{Ly}$ | $2 * n$ |
| K. | END | 1 |

FIG. 10

THE SYNCHRONOUS RAM 50: IMPLEMENTING THE BIST MARCH YZ ALGORITHM 153

| Line | Operation | No. Of Steps Per Operation |
|---|---|---|
| A. | START | 1 |
| B. | $\Leftrightarrow W^x$ | $1 * Word$ |
| C. | $\Uparrow R^x W^y R^y W^x$ | $4 * Word$ |
| D. | $\Uparrow R^x W^y$ | $2 * Word$ |
| E. | $\Uparrow R^y W^x R^x W^y$ | $4 * Word$ |
| F. | $\Uparrow R^y$ | $1 * Word$ |
| G. | $\Downarrow R^y W^x$ | $2 * Word$ |
| H. | $\Rightarrow WR^{L_y}$ | $2 * n$ |
| I. | END | 1 |

OPTIMIZED BUILT-IN SELF-TEST METHOD AND APPARATUS FOR RANDOM ACCESS MEMORIES

FIELD OF THE INVENTION

The present invention relates to an optimized built-in self-test method and apparatus for detecting a predetermined set of faults in memory modules.

BACKGROUND OF THE INVENTION

This invention relates to an optimized built-in self-test method and apparatus for detecting faults in memory circuits to ensure an acceptable quality level of the RAMs and, more particularly, to detecting one or more of stuck-open faults, retention faults or state coupling faults using both technology independent and dependent test methods and apparatus.

Computers generally consist of three subsystems: the CPU, input/output devices, and memory subsystems. Memory subsystems include static memory, e.g.,a hard drive, in which data or programs are stored for long term retrieval, and active memory, in which the results of program execution are temporarily stored. Active memory is usually made up of semiconductor memory chips such as Random Access Memory (RAM) chips. RAMs hold large quantities of data bits and afford short access time. However, such advantages necessitate a high cost per bit held in the RAM memory array. In addition, since memory chips are used in large quantities in digital systems, memory chip faults are a prime contributor to failure rates in such systems.

Ongoing developments for increasing the density of RAMs have resulted in an increased likelihood of faults. Historically, the number of bits per chip has quadrupled roughly every 3.1 (or $\pi$) years. This exponential increase in density means that the area per memory cell is decreasing exponentially. As a consequence, the charge stored in the capacitor of a RAM cell is decreasing rapidly, causing the cell to be more susceptible to disturbances due to use (noise, crosstalk, etc.) and in the manufacturing process (differences in the capacitance or leakage current).

Also, due to increased density, RAM cells are placed closer together, which makes them more sensitive to influences from neighboring cells, which increases the likelihood of disturbances due to noise on address and data lines. The influence of neighboring cells can also result in "linking faults," namely a fault occurring in one cell which causes a fault to occur in an otherwise properly functioning cell (referred to as a linked cell).

Accordingly, the quantity of faults and the likelihood of multiple, rather than single, faults occurring at a given time is increasing. Also, the types of faults which occur are increasing in complexity (e.g., linked faults).

At the same time, success in the memory industry is directly tied to controlling the production costs for RAMs, since fierce competition has driven down prices. The raw materials and fabrication steps for a RAM are relatively inexpensive, so the testing cost is the most significant production cost. The testing cost is primarily determined by the time required to test a given RAM. However, opposing the requirement for short testing times is the requirement that the tests be long enough to detect the various types of faults that are likely to occur. Accordingly, optimizing the testing time is constrained by the requirement that the test detect a given number of faults which ensure an acceptable quality level for RAMs.

Since effective memory testing lies on the critical path for preventing failures in digital systems and driving the industry, detection of increasingly complex faults must be accomplished using optimized tests. The process of designing an algorithm to accomplish this goal consists of the following: first, since testing for all possible faults is not feasible, the faults necessary to detect in order to ensure an acceptable quality level for a memory circuits, e.g., RAMs, are identified; and, second, the algorithm necessary to detect each individual fault is determined and combined into a single optimized algorithm for detecting the set of predetermined faults.

First, the basis for establishing a quality level acceptable for memory units is formulated by creating a fault model or precise descriptions of analog or digital defects that violate the memory's specifications. The resulting fault model will contain a set of predetermined faults to be detected in the memory. Fault modeling is an essential first step to the design of an optimized test. Many fault models for addressing single and multiple, and linked and unlinked, faults in memory circuits, e.g., RAMs, have been proposed in the art. In addition, individual faults included in such fault models are well known in the art.

Examples of traditional fault models are set forth in U.S. Pat. No. 5,513,318, issued on Apr. 30, 1996 and filed on Dec. 28, 1994, to A. J. van de Goor and Yervant Zorian and in the publications provided in the references cited section of such patent. In addition, traditional fault models are also provided in the article "*RAM Testing Algorithms For Detection Multiple Linked Faults*", by V. G. Mikitjuk, V. N. Yarmolik, A. J. van de Goor, *IEEE* 1996 *European Design & Test Conference*, pp. 435–439, Mar. 1996; in Table 4, fault types are provided in the column labeled DETECTED FAULTS. Subsets of the detected faults are applicable to the tests listed in the TEST column. For example, for the test MATS+, the fault model contains two faults, an Address Decoder Fault and a Stuck-At Fault. For the March A test, the fault model consists of the MATS+ test faults as well as a Transition Fault, an Inversion Coupling Fault, an Indempotent Fault and Linked Indempotent Faults.

However, there are additional faults which may be detected to ensure an acceptable quality level for RAMs. While the additional faults individually may be known, the combination of two or more particular faults to create an optimized fault model which ensures an acceptable quality level may be heretofore unknown. Therefore, there is a need to identify particular faults which must be included in a fault model in order to ensure an acceptable quality level for RAMs under test.

Second, with a given fault model, the algorithm necessary to detect each fault within the model is determined. The set of individual algorithms, each of which is applicable to a particular fault, is then combined and reduced based on a computational model to a single algorithm. The single algorithm is then optimized to use the smallest number of operations necessary to detect all faults in the given model. The purpose of optimizing the operations in the algorithm to the smallest number is to accelerate the testing time.

Currently, a family of algorithms, called March tests or March algorithms, are well known and have proven superior to other tests because of the simplicity of the algorithms and the resulting optimization of the testing times. A March test consists of a sequence of March elements. A March element is a finite sequence comprising one or more read/write operations applied to a cell in memory before proceeding to the next cell, so that every cell in the memory is completely tested in sequence.

Another well known mechanism with which to optimize the testing time is the inclusion of circuitry in a memory circuit which allows the chip to perform testing autonomously. This technique is well known in the art as "built-in self-test" or BIST. BIST allows the hardware of the memory circuit to test itself by automatically generating test patterns to stimulate the circuit and then evaluating the response. This technique shortens the testing time by avoiding the need to send test data to and from a RAM via scan-chains or other intervening logic.

The testing time of a BIST March algorithm is defined in part by the number of read/write operations it contains. The operations or steps, when multiplied by the total number n of distinct addresses (each containing one or more bits or cells) in a memory array, is part of the length component of the testing time. The testing time may be measured in total clock cycles needed to complete the test, where the clock cycles are a function in part of the algorithm length.

In addition, BIST March algorithms may be custom designed for testing the technology of particular RAMs. On the other hand, such algorithms may be generically designed for testing which is independent of the technology of such RAMs. An algorithm designed for testing a RAM independent of its technology will contain a greater number of operations than that customized to the technology of a RAM. As is obvious, this is because the number of variables in an algorithm applied to unknown technology is greater than those for known technology.

The process for detecting memory faults with algorithms, whether technology independent or dependent, in accordance with the present invention assumes that:

1. Where the memory array of a given memory, e.g., a RAM, is arranged such that m>1 bits are stored at each of n distinct addresses (i.e., the memory has a n×m organization), the m bits within each m-bit address are in a particular configuration, including the placement of each of bit and the neighborhood of the bits adjacent to it for each address.

2. Faults may be detected as to each m-bit address regardless of which bit within the address causes the fault, or as to each bit within each m-bit address.

3. In order to test faults within each bit of a m-bit address, a read/write test pattern (or background pattern) corresponding to the m-bit configuration must be used by the BIST March algorithm.

Where the m-bit configuration is included in the BIST March algorithm as a variable, the algorithm is technology independent. In this case, faults within m-bit addresses are only detected by reexecuting the algorithm using background patterns for each possible m-bit configuration. Where the mi-bit configuration is included in the algorithm as a constant, the algorithm is technology dependent. Accordingly, faults within the m-bit addresses can be detected during one execution of the algorithm because the background pattern corresponding to the m-bit configuration is known.

Examples of such BIST March algorithms are treated in the article "*RAM Testing Algorithms For Detection Multiple Linked Faults*", (described above). In that article, a BIST March M algorithm is presented as having a higher fault coverage than prior BIST March tests. The algorithm has a 16n-length or consists of 16 separate read/write operations performed on each memory address n in a RAM memory array.

In general, BIST March algorithms can be improved upon by determining an optimized set of predetermined faults to ensure an acceptable quality level. The algorithm may then be optimized to accelerate the testing time by reducing the number of read/write operations necessary to detect the set of predetermined faults. With ongoing increases in the density of RAMs and the primary importance of the testing time in production costs, there is a need to improve BIST March algorithms.

SUMMARY OF THE INVENTION

The present invention is directed to a method and apparatus for detecting an optimized set of predetermined faults which ensure an acceptable quality level for memories. The method and apparatus comprise a BIST March algorithm optimized to accelerate the testing time by reducing the number of read/write operations necessary to detect an optimized set of predetermined faults.

One aspect of the present invention is the determination or identification of particular faults for an optimized fault model which ensures an acceptable quality level for RAMs. In order to determine the fault model, we performed defect analyses on a reasonably large sample of the population of RAMs. We included in the fault model defects which have the highest incidence rates. Detecting such faults during the testing of RAMs ensures the lowest defect rate for the population.

In performing such analyses, we have found that 9 faults (also referred to as fault types) comprise an optimized fault model which ensures the highest quality level. The 9 faults are as follows: F1-Address Decoder Fault, F2-Stuck-At Fault, F3-Transition Fault, F4-Indempotent Coupling Fault, F5-Linked Coupling Faults, F6-Linked Transition and Coupling Faults, F7-Stuck-Open Fault, F8-Retention Fault and F9-State Coupling Fault. In the alternative, we have found that the first 6 faults (numbered F1 through F6) and any of one or more of the additional 3 faults (numbered F7 through F9), comprise an optimized fault model which ensures an acceptable quality level.

Another aspect of the present invention is the consolidation of the set of individual algorithms necessary to detect each fault within the predetermined fault model into a single algorithm. For the fault model which ensures the highest quality level for RAMs, comprising faults F1–F9, and for technology independent algorithms in accordance with the present invention, we achieved the length (i.e., a component of the testing time) of $14n*(\log_2 m+1)$, where n is the number of distinct addresses and m is the number of bits in each m-bit memory address of the RAM. In addition, for the highest quality level, we achieved the length of 14n for technology dependent algorithms in accordance with the present invention.

In addition, we found that no prior art BIST March algorithms detect the optimized fault models of the present invention with testing times as short as the testing times of the BIST March algorithm in accordance with the present invention.

An illustrative embodiment of the algorithm in accordance with present invention comprises a series of steps or operations grouped by sequences. The first sequence (I) of operations comprises a step (1) single write operation $W^x$, which writes a first bit pattern x (e.g., all logic 0s) into each successive row of cells in a memory address, beginning with either the lowest order or the highest order row, since the address order is irrelevant ($\leftrightarrow$)

The second sequence of operations (II) begins with a step (2) read operation $R^x$, which reads the bits in each successive row of cells to detect the presence of the first bit pattern x. After the step (2) read operation $R^x$, a step (3) write operation $W^y$ is performed on the same row of cells (and in the same sequence), which writes the second bit pattern y (the complement of bit pattern x, e.g., all logic 1s) in the row. Following the step (3) write operation $W^y$, a step (4) read operation $R^y$ is performed on the same row, which reads the second pattern of bits y to detect the presence of the second bit pattern y. The last operation in the sequence (II) is a step (5) write operation $W^x$ performed on the same row, which writes the first pattern of bits x into the row over the previously written second bit pattern y. The operations of step (2) $R^x$, step (3) $W^y$, step (4) $R^y$ and step (5) $W^x$, are then performed in sequence on each successive row of memory cells, beginning with the lowest order row, since the address order is increasing ($\rightarrow$).

Following the operation of sequence (II), a third sequence of operations (III) is performed, comprising the previously described read operation $R^x$ (as step (6)) and write operation $W^y$ (as step (7)). The operations of step (6) $R^x$ and step (7) $W^y$, are performed in sequence on each successive row of memory cells, beginning with the lowest order row, since the address order is increasing ($\rightarrow$).

The third sequence of operations (III) is followed by a fourth sequence of operations (IV), comprising the above-described read operation $R^y$ (as step (8)), write operation $W^x$ (as step (9)) read operation $R^x$ (as step (10)) and write operation $W^y$ (as step (11)). The operations of step (8) $R^y$, step (9) $W^x$, step (10) $R^x$ and step (11) $W^y$, are performed in sequence on each successive row of memory cells, beginning with the lowest order row, since the address order is increasing ($\rightarrow$).

After the fourth sequence of operations (IV), a fifth sequence of operations (V) is performed; it comprises a step (12) read operation $R^y$, which reads the bits in each successive row of cells to detect the presence of the second bit pattern y, beginning with either the lowest order or highest order row, since the address order is irrelevant ($\leftrightarrow$).

The fifth sequence of operations (V) is followed by a sixth (VI) sequence of operations, comprising the previously described read operation $R^y$ (as step (13)) and write operation $W^x$ (as step (14)). The operations of step (13) $R^y$ and step (14) $W^x$, are performed in sequence on each successive row of memory cells, beginning with the highest order row and continuing to the lowest order row, since the address order is decreasing ($\leftarrow$).

BRIEF DESCRIPTION OF THE DRAWINGS

The foregoing and other features and advantages of the present invention will be more readily apparent from the following detailed description and drawings of illustrative embodiments of the present invention in which:

FIG. 1 is a table illustrating several prior art BIST March algorithms and the fault models which each such prior art algorithm detects;

FIG. 2 is a table illustrating several alternative embodiments of a BIST March algorithm for testing a RAM in accordance with the present invention and the fault models which each such alternative embodiment algorithm detects;

FIG. 3 is a table illustrating the steps of the BIST March algorithm for testing a RAM in accordance with the present invention;

FIG. 4 is a table illustrating the steps of a prior art BIST March M algorithm;

FIG. 5 is a table illustrating the steps of a first alternative embodiment of the BIST March algorithm for testing a RAM in accordance with the present invention;

FIG. 6 is a table providing pseudo-code for the first alternative embodiment of the BIST March algorithm for testing a synchronous RAM in accordance with the present invention;

FIG. 7 is a table providing pseudo-code for the first alternative embodiment of the BIST March algorithm for testing an asynchronous RAM in accordance with the present invention;

FIG. 8 is a table providing pseudo-code for said BIST March algorithm for testing a synchronous RAM in accordance with the present invention;

FIG. 9 is a table providing pseudo-code for a second alternative embodiment of the BIST March algorithm for testing a synchronous RAM in accordance with the present invention;

FIG. 10 is a table providing pseudo-code for a third alternative embodiment of the BIST March algorithm for testing a synchronous RAM in accordance with the present invention.

DESCRIPTION OF THE ILLUSTRATIVE EMBODIMENTS

Figure 11:
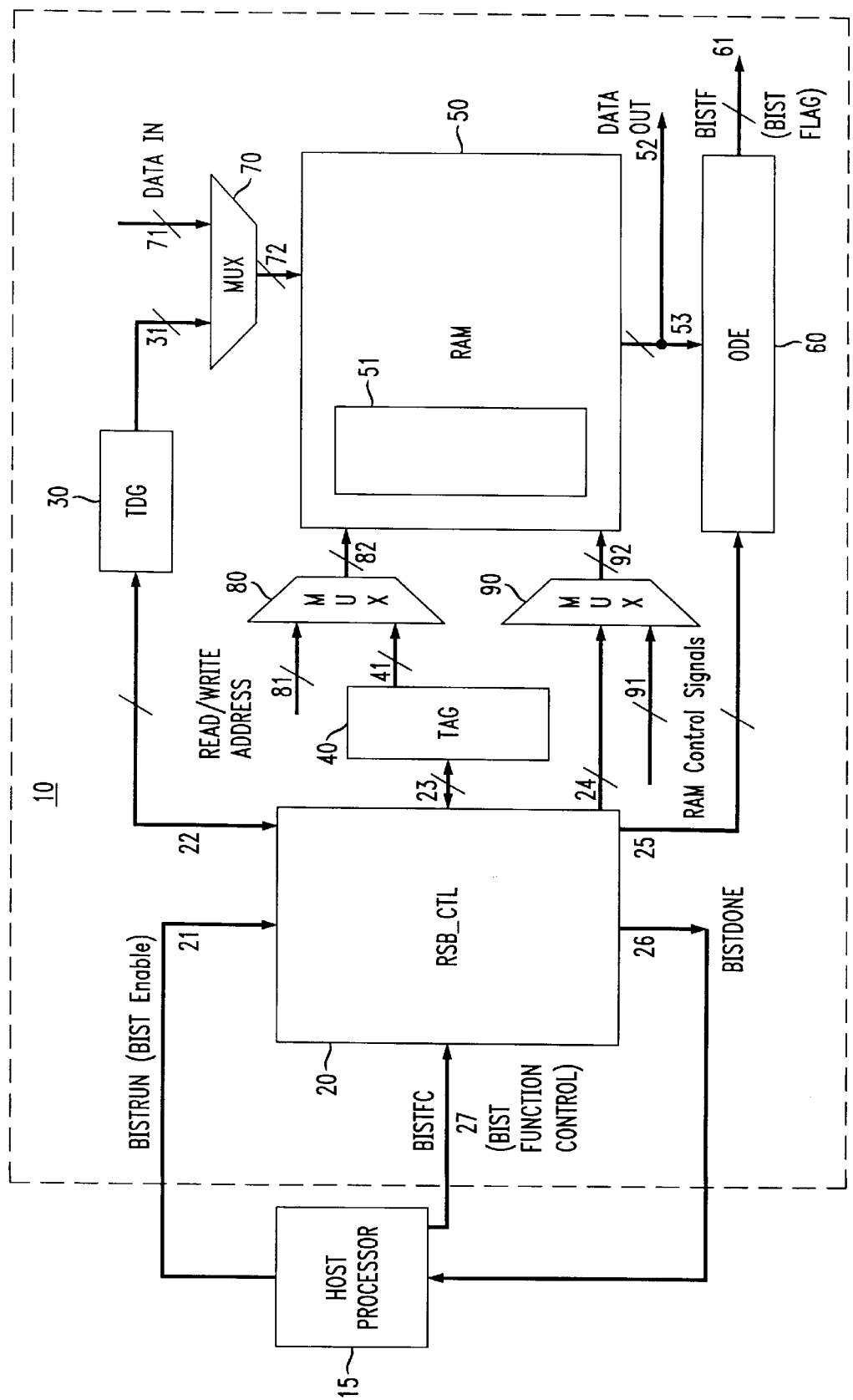
FIG. 11 is a schematic block diagram illustrating a BIST hardware architecture for implementing the first alternative embodiment of the BIST March algorithm for testing a synchronous RAM in accordance with the present invention.

A fault model for testing a RAM 50 (FIG. 11) includes three types of functional faults: memory, read/write logic and address faults. Memory faults are faults which may occur in a memory cell array; read/write logic faults may be mapped onto functional equivalent faults in the memory cell array of the RAM 50.

Determining a fault model requires performing defect analyses on a reasonably large sample of the population of RAMs. Defects which have the highest incidence rates are included in the fault model. Detecting such faults ensures the lowest defect rate for the population.

In performing such analyses, we have found that the 9 faults set forth below comprise an optimized fault model which ensures the highest quality level. In the alternative, we have found that the first 6 faults (numbered F1 through F6) and any of one or more of the additional 3 faults (numbered F7 through F9), comprise an optimized fault model which ensures an acceptable quality level. Accordingly, alternative embodiments of the fault model of the present invention include faults F1–F6 and one or more of the faults F7, F8 or F9, set forth as follows:

F1. Address Decoder Faults (F1-AFs) involve failure to address the correct word or cell stored in the RAM 50. Such faults may be classified in four categories as follows:

F1-AF-I: For a particular address, no cell is addressed.

F1-AF-II: A particular cell is not accessible.

F1-AF-III: For a particular address, multiple cells are accessed simultaneously.

F1-AF-IV: A particular cell can be accessed with multiple addresses.

F2. Stuck-At Fault (F2-SAF) is characterized by the presence of a logic 1 or 0 in a cell in the RAM 50 notwithstanding the fact that 0 or 1, respectively, has been previously written to that cell, i.e. the logic value of the cell can not be changed by any action on the cell or by influences from other cells.

F3. Transition Fault (F3-TF) is characterized by the failure of the value of a bit stored in a cell of the RAM 50 to transition from logic 1 to 0 (or vice versa), where it has that capability.

F4. Indempotent Coupling Fault (F4-$CF_{id}$) involves a single fault occurring in a coupled cell b, due to an operation performed on a coupling cell a. More particularly, the fault is sensitized by a transition write operation to the coupling cell a, which results in the occurrence of such fault in the coupled cell b. The fault occurs when such transition forces the contents of the coupled cell b to a fixed value (either logic 0 or 1).

F5. Linked Coupling Faults (F5-$CF_{id}$-$CF_{id}$) are characterized by the simultaneous occurrence of two coupling faults.

F6. Linked Transition and Coupling Faults (F6-TF-$CF_{id}$) are characterized by the simultaneous presence of a transition fault and a coupling fault.

The Linked Coupling Faults (F5) and Linked Transition and Coupling Faults (F6) are collectively identified by the term Linked Faults (LFs).

F7. Stuck-Open Fault (F7-SOF) is characterized by an open read or write line to a storage location so that the value read from the RAM 50 corresponds to a previously written value rather than its current value.

F8. Retention Fault (F8-RF) is characterized by the loss of a data value stored in a cell in the RAM 5C, over time.

Faults F1-F8 described up to this point are detected on the level of a set of one or more bits (or memory cells) stored at each memory address of a memory array. Where a single bit is stored for each of n distinct addresses (i.e., the memory has a n×1 organization), faults F1–F8 are detected as to each bit or memory cell separately. However, where m>1 bits are stored at each of n distinct addresses (i.e., the memory has a n×m organization), faults F1–F8 are detected as to the set of m-bits (or m-bit words) at a given memory address, rather than each of the m bits within the word at such memory address.

However, the following fault 9 involves defects occurring in bits or memory cells as to any bit within a m-bit word (where m>1):

F9. State Coupling Fault (F9-$CF_{st}$) occurs when the content of the coupled cell b is forced to a fixed value (either logic 0 or 1) in response to read operations, only if the coupling cell a is in a fixed state (either logic 0 or 1). Four different combinations of fixed value and state are applicable to F9-$CF_{st}$S, 0;0, 0;1, 1;0 and 1;1.

Many fault models for RAMs as well as tests optimized for such fault models are known in the art. Referring to FIG.1, there is a table showing several prior art fault models, identified in the columns under the DETECTED FAULTS section. FIG. 1 also provides the prior art algorithms corresponding to each of those fault models, as shown in the TEST column. For example, for the prior art algorithm March C-, the fault model contains five faults, AF, SAF, TF, Inversion Coupling Fault ($CF_{in}$) and $CF_{id}$. The most comprehensive fault model shown in FIG. 1 is that for the prior art BIST March M algorithm, which includes AF, SAF, TF, $CF_{in}$, TF-CF, $CF_{id}$-$CF_{id}$, $CF_{in}$-$CF_{in}$, and $CF_{in}$-$CF_{id}$.

Referring to FIG. 2, in accordance with the present invention, methods are provided for testing the RAM 50 to detect functional memory, read/write logic and address faults. Such methods are derived from a base BIST March YZ algorithm 150, which detects faults F1–F9 in a technology dependent model.

Alternative embodiments of the algorithm 150 are set forth in FIG. 2, including a BIST March YZ algorithm 151, which applies algorithm 150 to a technology independent model and thus takes longer than the algorithm 150. Additional alternative embodiments (in FIG. 2) are a BIST March YZ algorithm 152 (which does not detect F9), and a BIST March YZ algorithm 153 (which does not detect F8 and F9). With algorithms 152 and 153, dependence on the technology of the memory device is irrelevant. These alternate embodiments detect various of the faults F1–F9 as shown in the columns under DETECTED FAULTS. Each of the algorithms 150, 151, 152 and 153 detect fault models including 7 or more of the faults F1–F9. The algorithms 150 and 151 detect faults F1–F9, the algorithm 153 detects faults F1–F8 and the algorithm 154 detects faults F1–F7.

The difference between the faults models identified in FIG. 1 and those in accordance with the present invention as shown in FIG. 2 are twofold: first, the present invention includes the detection of one or more of three additional faults, F7-SOF, F8-RF and F9-$CF_{st}$; second, the present invention excludes the three faults in FIG. 1 identified as Inversion Coupling Fault ($CF_{in}$) and any Linked Faults involving such $CF_{in}$s.

As to the first difference, we have determined that the incidence of F7-SOF, F8-RF and F9-$CF_{st}$ in the population of RAMs is high, so that the detection of one or more of such faults is necessary to ensure an acceptable quality level. As to $CF_{in}$ faults presented in FIG. 1, a $CF_{in}$ occurs when a fault is sensitized by a transition write operation to a coupling cell a, resulting in the inversion of the contents of coupled cell b. We have determined that the incidence of this particular fault is extremely low, such that its detection is unnecessary to ensure an acceptable quality level. Since detection of the $CF_{in}$ fault is unnecessary, an algorithm which detects it may include unnecessary steps (such as in the prior art March M algorithm), thereby unnecessarily increasing the testing time for the algorithm.

The read and write operations for each of the algorithms 150, 151, 152 and 153 are also presented in FIG. 2 in the DESCRIPTION OF THE ALGORITHM column. The terms shown in FIG. 2 as well as FIG. 3 are defined as follows: R means a read operation; W means a write operation; x is a first bit pattern (e.g., all logic 0s) and y is a second bit pattern which is the complement of the x bit pattern (e.g., all logic 1s); ($\rightarrow$) indicates that a read/write operation is performed in an increasing address order (e.g., commencing at the lowest order location and proceeding to the highest order location), ($\leftarrow$) indicates a read/write operation in a decreasing address order (i.e., the opposite of the increasing address order); and, ($\leftrightarrow$) indicates that the address order is irrelevant.

The descriptions of the algorithms 150, 151, 152 and 153 are identical in that they have the same read and write operations. That is, the algorithm 151 comprises one or more executions of the base algorithm 150 for detecting a fault model. Each of the algorithms 152 and 153 comprise one execution of the base algorithm 150 for the detection of their fault models.

The LENGTH COMPONENT OF TESTING TIME column of FIG. 2 provides the length portion of the calculation for the testing time of each of the algorithms 150, 151, 152 and 153. Such length component includes the total number n of distinct addresses in the memory array and the total number of m bits within each m-bit address.

The base algorithm 150 of FIG. 3 is distinguishable from each algorithm of the FIG. 1, which are representative prior art algorithms, particularly the prior art BIST March M algorithm. Referring to FIG. 4, there is shown the prior art March M algorithm. The base algorithm 150 can be distinguished from the prior art March M algorithm in at least two respects: first, the base algorithm 150 is an improvement over the prior art March M algorithm in terms of the number of steps; second, as described above, the alternative embodiments 151, 152 and 153 of the base algorithm 150 are used to detect faults which were not included in the fault model for the prior art March M algorithm.

The base algorithm 150 as set forth in tabular form (FIG. 3) comprises 14 steps, labeled (1)–(14) (as shown in the third and fourth columns), these steps can be grouped into 6 sequences (or March elements), labeled (I)–(VI) (as shown in the first column, SEQ.). Each of the 6 sequences is applied in a predetermined address order (as shown in the second column, ADD. ORD.). The fourth column includes the same terms as used in the DESCRIPTION OF ALGORITHM column of FIG. 2.

Each step in the algorithm 150 comprises one of the following operations: writing a first bit pattern x (e.g., all logic 0s) into a row of memory cells ($W^x$); writing a second bit pattern y (which is the complement of the first bit pattern x, e.g., for bit pattern y, all logic 1s) into a row of cells ($W^y$); reading a row of cells with an expected value of the first bit pattern x ($R^x$); and, reading a row of cells with an expected value of the second bit pattern y ($R^y$).

The first sequence (I) of operations comprises a step (1) which is a single write operation $W^x$ which writes the first bit pattern x into each successive row of cells in the RAM 50, beginning with either the lowest order or the highest order row, since the address order is irrelevant ($\leftrightarrow$).

The second sequence of operations (II) begins with a step (2) in the form of a read operation $R^x$, which reads the bits in each successive row of cells to detect the presence of the first bit pattern x. After the step (2) read operation $R^x$, a step (3), which is a write operation $W^y$, is performed on the same row of cells (and in the same sequence), which writes the second bit pattern y in the row. Following the step (3) write operation $W^y$, a read operation $R^y$ (step 4) is performed on the same row, which reads the second pattern of bits y to detect the presence of such second bit pattern y. The last operation in the sequence (II) is a step (5), in the form of a write operation $W^x$ performed on the same row, which writes the first pattern of bits x into the row over the previously written second bit pattern y. The operations of step (2) $R^x$, step (3) $W^y$, step (4) $R^y$ and step (5) $W^x$, are then performed in sequence on each successive row of memory cells, beginning with the lowest order row, since the address order is increasing ($\rightarrow$).

Following the operation of sequence (II), a third sequence of operations (III) is performed, comprising the previously described read operation $R^x$ (as step (6)) and write operation $W^y$ (as step (7)). The operations of step (6) $R^x$ and step (7) $W^y$, are performed in sequence on each successive row of memory cells, beginning with the lowest order row, since the address order is increase ($\rightarrow$).

The third sequence of operations (III) is followed by a fourth sequence of operations (IV), comprising the above-described read operation $R^y$ (as step (8)), write operation $W^x$ (as step (9)), read operation $R^x$ (as step (10)) and write operation $W^y$ (as step (11)). The operations of step (8) $R^y$, step (9) $W^x$, step (10) $R^x$ and step (11) $W^y$, are performed in sequence on each successive row of memory cells, beginning with the lowest order row, since the address order is increasing ($\rightarrow$).

After the fourth sequence of operations (IV), a fifth sequence of operations (V) is performed; it comprises a step (12), which is a read operation $R^y$, which reads the bits in each successive row of cells to detect the presence of the second bit pattern y, beginning with either the lowest order or highest order row, since the address order is irrelevant ($\leftrightarrow$).

The fifth sequence of operations (V) is followed by a sixth (VI) sequence of operations, comprising the previously described read operation $R^y$ (as step (13)) and write operation $W^x$ (as step (14)). The operations of step (13) $R^y$ and step (14) $W^x$, are performed in sequence on each successive row of memory cells, beginning with the highest order row and continuing to the lowest order row, since the address order is decreasing ($\leftarrow$).

As is apparent from the description above, each step of a given sequence of the algorithm 150 is performed at a particular address, and only upon completion of the process at that address are any operations performed on the next address. For example, steps (2)–(5) of sequence (II) are each performed at the lowest order address before the next cell is identified for processing based on the increasing ($\rightarrow$) address order.

It should further be noted that in the algorithms 151, 152 and 153, increasing ($\rightarrow$) and decreasing ($\leftarrow$) address orders are necessary only to the extent of their inverse relationship to one another; the sole requirement is that the address orders maintain an inverse relationship as provided within a given algorithm. For example, in the base algorithm 150, the increasing ($\rightarrow$) and decreasing ($\leftarrow$) address orders may be reversed, so long as every increasing and decreasing address order in the base algorithm 150 is reversed.

In addition, in alternative embodiments of the algorithm 150 in accordance with the present invention, the fourth sequence of operations (IV) shown in FIG. 3, may also be performed in sequence in a decreasing ($\leftarrow$) address order, beginning with the highest order row and continuing to the lowest order row. Such alternative embodiments may be applied to the same fault models and in the same manner as the algorithms 150, 151, 152 and 153. Accordingly, such alternative embodiments in accordance with the present invention are the same as the algorithms 150, 151, 152 and 153 regarding sequences, steps, address orders for sequences (I) through (III) and (V) and (VI), application to fault models and length, except that the fourth sequence (IV) is in decreasing ($\leftarrow$) address order. In this event, sequence (IV) of an alternative embodiment in accordance with the present invention would be further distinguishable from sequences (II) and (IV), each with an increasing address order, of the prior art March M algorithm of FIG. 4.

Also, the first and second bit patterns x and y are necessary only to the extent of their complementary relationship to one another. For example, in a given algorithm, each of the bit patterns x and y may be reversed, so long as each bit pattern in the base algorithm 150 is reversed.

It should be further noted that the base algorithm 150 may be applied to single bit memory addresses in a n×1 architecture or to two or more bits (also called m-bit Words) memory addresses in a n×m architecture without effecting its operation or fault detection capability. The base algorithm 150 of the present invention therefore is equally applicable to a single memory cell memory address and to any successive number of cells, including a word or byte, in a given memory address.

It should further be noted that the base algorithm 150 is not limited to implementation under the BIST technique. Rather, the base algorithm 150 may be implemented using bit patterns x and y provided by test equipment external to the memory device. Accordingly the present invention may be implemented using either internal (e.g., BIST) or external test equipment.

The length component of the testing time of the base algorithm 150 is the number of steps of such base algorithm 150, or 14 steps, applied to each address in the memory array of the RAM 50, i.e., 14n.

Referring to FIG. 4, there is shown the prior art March M algorithm in tabular form. FIG. 4 contains the same column titles as FIG. 3 and the terms used in columns one through three of FIG. 3 are the same as FIG. 4. However, column four of FIG. 4 contains the following terms: r means a read operation, w means a write operation, 0 means the logic value of 0 and 1 means the logic value of 1.

The first distinction between the present invention base March YZ algorithm 150 (FIG. 3) and the prior art March M algorithm (FIG. 4) is that the March M algorithm contains particular steps (6) and (9) which the base algorithm 150 does not. Thus, the prior art March M algorithm has a length component of the testing time of 16n for its fault model. It appears that one of the purposes of steps (6) and (9) in the prior art March M algorithm is to detect single and linked $CF_{in}$s. As to the base algorithm 150, we have determined that the fault model of the present invention does not include inversion coupling faults ($CF_{in}$s) in single or linked form. This is because we have determined that $CF_{in}$s are unnecessary to ensure an acceptable quality level. Accordingly, the base algorithm 150 detects an acceptable quality level fault model without the two additional steps of the prior art March M algorithm.

Secondly, as described above, the alternative embodiment algorithms 151, 152 and 153 of the base algorithm 150, are used to detect faults which were not part of the fault model for the prior art March M algorithm. Namely, the algorithms 150 and 151 detect three additional faults types F7-SOF, F8-RF and F9-$CF_{st}$s, the algorithm 152 detects two additional faults types F7-SOF and F8-RF and the algorithm 153 detects an additional fault type F7-SOF.

It should also be noted that the number of steps necessary to detect F9-$CF_{st}$ is a multiple of the base algorithm 150 where the algorithm, e.g., the algorithm 151 is technology independent. This is because the F9-$CF_{st}$s involve bits within a m-bit address rather than as to the m-bit address as a whole, requiring that the base algorithm 150 be executed multiple times. Thus, where F9-$CF_{st}$ is detected, the length component of the testing time of the algorithm 151 will be a multiple of the 14n length as a function of the value of m. In this event, the length of the algorithm 151 may be much larger than 14n or even 16n (of the prior art March M algorithm). However, we have determined that F9-$CF_{st}$s are necessary to ensure an acceptable quality level for RAMs. Therefore, the resulting length component of the testing time of the algorithm 151 (as described further below) is the optimal test length with which F9-$CF_{st}$s may be detected. In addition, as shown in FIG. 1, the prior art March M algorithm does not detect F9-$CF_{st}$s.

One aspect of the present invention is that the alternative embodiment algorithm 151 may be applied to the RAM 50 regardless of whether the technology extant in the RAM 50 is incorporated into the algorithm 151. That is, the algorithm 151 is technology independent. The base embodiment algorithm 150 may be applied to the RAM 50 only where the technology extant in the RAM 50 is known, i.e., the algorithm 150 is technology dependent. In addition, whether the technology of the RAM 50 is known also effects the length components of the testing times of such algorithms 150 and 151.

The difference between the algorithms 150 and 151 as to knowledge of the RAM 50 technology determines how F9-$CF_{st}$s are detected. F9-$CF_{st}$s involve faults in memory cells or bits within a m-bit address (where m>1). In a given RAM, the m bits within each m-bit address are in a particular configuration, including the placement of each bit and the neighborhood of the bits adjacent to it for each address. In order to test faults within bits of a m-bit address, the bit pattern (i.e., background pattern) x (and the complement to bit pattern x, bit pattern y) must correspond to the m-bit configuration.

The m-bit configuration is included in the algorithm 151 as a variable. Hence, the algorithm 151 is independent of the technology of the m-bit configuration extant in the RAM. Therefore, the algorithm 151 must be reexecuted for each possible m-bit configuration applied to bit patterns x and y in order to detect F9-$CF_{st}$s.

More particularly, in order for the algorithm 151 to detect all F9-$CF_{st}$s, following the execution of steps (1)–(14), the steps are executed again for each of several different m-bit configurations. That is, the base algorithm 150 used by algorithm 151 must be reexecuted multiple times. This allows the algorithm 151 to properly test for the presence of F9-$CF_{st}$s occurring as the result of one bit in a m-bit address improperly influencing the value of the bit in an adjacent location in each possible m-bit configuration. In practice, $\log_2 m+1$ separate patterns are needed to ensure that the actual m-bit configuration is applied by the algorithm 151.

For example, if the value of m is 8, then 4 background test patterns are needed to detect all F9-$CF_{st}$s. To continue the example, during the first execution of steps (1)–(14) of the algorithm 150 used by the algorithm 151, a background pattern for bit patterns x and y of all ones and zeros, respectively, is written. Next, for the second execution in steps (15)–(28), a background pattern for bit pattern x of (0 0 0 0 1 1 1 1) and its complement bit pattern y (1 1 1 1 0 0 0 0) are written. Thereafter, for the third execution in steps (29)–(42), a background pattern for bit pattern x of (0 0 1 1 0 0 1 1) and its complement bit pattern y of (1 1 0 0 1 1 0 0) are written. This background pattern is followed by a bit pattern x of (0 1 0 1 0 1 0 1) and its complement bit pattern y of (1 0 1 0 1 0 1 0) in the fourth and final execution in steps (43)–(56).

As another example, when m equals 4, $\log_2 4+1$ or 3 separate background patterns corresponding to 3 separate bit patterns of x (and y) are necessary. Accordingly, steps (1)–(14) of the base algorithm 150 used by the algorithm 151 must be executed $\log_2 4+1$ or 3 times for a total of 14n* ($\log_2 4+1$) or 42n steps. Upon completion of the executions of the base algorithm 150 used by the algorithm 151 where the bit pattern x corresponds to the m-bit configuration, all F9-$CF_{st}$s will be detected.

In addition, the length of the algorithm 151 is increased since it comprises multiple executions of the steps (1)–(14) of the base algorithm 150. Namely, while the length of the base algorithm 150 is 14n, the length of the algorithm 151, as a function of n and m, is 14n*($\log_2 m+1$).

The m-bit configuration extant in the RAM 50 is included in the algorithm 150 as a constant. Hence, the algorithm 150 is dependent on the technology of the m-bit configuration. Therefore, only one execution or a single pass of steps (1)–(14) of the base algorithm 150 using one set of bit patterns x and y corresponding to the known m-bit pattern is needed to detect all F9-$CF_{st}$s. Since the algorithm 150 does not require multiple executions of steps (1)–(14), the length of the algorithm 150 is 14n.

It should be noted that as to the algorithm 151 applied to a n×1 architecture memory array, only a single pass of steps (1)–(14) of the base algorithm 150 is needed since the number of executions according to $\log_2 1+1$ is 1. In this event, the algorithm 151 is identical to the algorithm 150.

As to the algorithms 152 and 153, neither alternative embodiment detects F9-$CF_{st}$s. In addition, the detection of faults F1–F8 applicable to algorithms 152 and 153 involves the set of bits of m-bit addresses rather than bits within each m-bit addresses. Accordingly, knowledge of the m-bit configuration is not applicable to the algorithms 152 and 153. As a result, for both algorithms 152 and 153, only one execution or a single pass of steps (1)–(14) of the base algorithm 150 using one set of bit patterns x and y is needed, but F9-$CF_{st}$s are not detected. These are technology independent. The lengths of the algorithms 152 and 153 based on one execution of steps (1)–(14) of the base algorithm 150 is 14n.

It should be noted that the algorithms 150, 151, 152 and 153 are merely representative as to one or more of the faults F1–F9 which may be included in a fault model applicable to the base algorithm 150. Additional alternative embodiments of the base algorithm 150 may be designed according to the principles of the present invention. Such additional alternative embodiments may detect any one or a combination of two or more of the faults F7–F9 in the fault model, namely, F7-SOF, F8-RF and/or F9-$CF_{st}$. In addition, the principals of the present invention may be applied to such additional alternative embodiments to determine their length, e.g., 14n or 14n*($\log_2$m+1).

As may now be appreciated, another aspect of the present invention is the detection by each of the algorithms 150, 151, 152 and 153 of the faults within each of their fault models. Each of the algorithms 151, 152 and 153 detect faults within its fault model by one or a combination of the sequences (I)–(VI) or steps (1)–(14) of the base algorithm 150 shown in FIG. 3. The algorithm 151 covers the largest number of faults and is technology independent. Therefore the algorithm 151 will be described in depth regarding the sequence and/or steps during which particular faults F1–F9 of the fault model are detected.

Referring to FIG. 5, the algorithm 151 is set forth in tabular form. FIG. 5 contains the same column titles and terms used in the columns as FIG. 3. It is applied, by way of example, to a memory array with a nxm architecture where m equals 4. Accordingly, steps (1)–(14) of the base algorithm 150 must be executed $\log_2$4+1 or 3 times for a total of 14n*($\log_2$4+1) or 42n steps.

The sequence (or March element) and/or steps of the algorithm 151 during which particular faults F1–F9 of the fault model are detected is as follows: F1-Address Faults (F1-AFs) occur as a result of a fault in the address decoding logic. Such faults include: no cell is addressed for a particular address (F1-AF-I), a particular cell is not accessible for a particular address (F1-AF-II), multiple cells are accessed simultaneously (F1-AF-III), and a particular cell can be accessed with multiple addresses (F1-AF-IV).

All F1-AFs are manifest when a March element sequence satisfies one of either of the following conditions:

first, in an increasing address order, a read operation of bit pattern x, following any number of read or write operations (regardless of the bit pattern), and terminating with a write operation of bit pattern y; or, second, in a decreasing address order, a read operation of bit pattern y, following any number of read or write operations (regardless of the bit pattern), and terminating with a write operation of bit pattern x. Since sequences (III) and (VI) satisfy these first and second conditions, respectively, all F1-AFs will be manifested by such sequences in the first execution, namely steps (6)–(7) and (13)–(14), of the base algorithm 150 used by the algorithm 151.

A F2-Stuck-At Fault (F2-SAF) occurs as a result of an inability of the logic value of a cell to be changed by any action on the cell or by influences from other cells. A F2-SAF will be manifest by each sequence (II) and (IV) because the bit patterns x and y are read into and written from every memory cell. All F2-SAFs will be manifested by such sequences in the first execution, namely steps (2)–(5) and (8)–(11), of the base algorithm 150 used by the algorithm 151.

A F3-Transition Fault (F3-TF) occurs as a result of the inability of a cell to transition from a logic 0 to logic 1 or visa versa. A F3-TF will be manifest by each sequence (II) and (IV) because each sequence generates a transition in a cell, e.g., bit pattern x to y or visa versa, and immediately thereafter, the cell is read. All F3-TFs will be manifested by such sequences in the first execution, namely steps (2)–(5) and (8)–(11), of the base algorithm 150 used by the algorithm 151.

A F4-Indempotent Coupling Fault (F4-$CF_{id}$) involves a coupling cell a and a coupled cell b, where the fault is sensitized by a transition write operation to a particular coupling cell a. It occurs when such a transition forces the contents of coupled cell b to a fixed value (either logic 0 or 1). A F4-$CF^{id}$ will be manifest by the combination of sequences (IV) and (V) because sequence (IV) contains two write operations and sequence (V) contains only one read operation. F4-$CF_{id}$s will be manifested by the combination of such sequences in the first execution, namely steps (8)–(12), of the base algorithm 150 used by the algorithm 151.

A Linked Fault (LF) occurs where the behavior of one fault influences the behavior of another fault. Moreover, as a consequence, faults may mask each other. LFs may occur between faults of the same type or faults of different types, namely F5-TF-$CF_{id}$ and F6-$CF_{id}$-$CF_{id}$.

A F5-TF-$CF_{id}$ Linked Fault will be manifest by the same sequences used to detect F3-TFs, namely each sequence (II) and (IV). This is because each sequence generates a transition in a cell, e.g. bit pattern x to y or visa versa, and immediately thereafter, the cell is read. In addition, since no other cells are written in between, a F5-TF cannot be masked by a F5-$CF_{id}$. Accordingly, each F5-TF-$CF_{id}$ will be manifested by such sequences in the first execution, namely steps (2)–(5) and (8)–(11), of the base algorithm 150 used by the algorithm 151.

A F6-$CF_{id}$-$CF_{id}$ Linked Fault will be manifest by a combination of sequences of the first run of the algorithm 151. Where the address orders of sequences (II) and (IV) are as shown in FIG. 5, one of the F6-$CF_{id}$s which is linked will be detected. For a F6-$CF_{id}$ with the shortest distance between a coupled cell b and a coupling cell a, if b has a larger address than a, there are two conditions possible:

where b is forced to a fixed logic value 1, the F6-$CF_{id}$ will be manifest by sequence (I), step (1); and, where b is forced to a fixed logic value 0, the F6-$CF_{id}$ will be manifest by sequence (IV), step (8). Similarly, for a F6-$CF_{id}$ with the longest distance between a and b, if b has a smaller address than a, the two conditions are as follows:

where b is forced to a fixed logic value 0, the F6-$CF_{id}$ will be manifest by the combination of sequence (II) and sequence (III) step (6) only, hence steps (2)–(6); and, where b is forced to a fixed logic value 1, the F6-$CF_{id}$ will be manifest by the combination of sequences (IV) and (V), hence steps (8)–(12).

Therefore, each F6-$CF_{id}$-$CF_{id}$ will be manifested by such steps in the first execution of the base algorithm 150 used by the algorithm 151.

A F7-Stuck-Open Fault (F7-SOF) occurs: as a result of the inability of a cell to reflect the value previously written therein. A F7-SOF will be manifest by each sequence (II) and (IV) because the bit patterns x and y are read into and written from every memory cell. All F7-SOFs will be manifested by such sequences in the first execution, namely steps (2)–(5) and (8)–(11), of the base algorithm 150 used by the algorithm 151.

A F8-Retention Fault (F8-RF) occurs as a result of a leakage of one or more bits in a previously written cell or word over time. In order to detect an F8-RF, a hold period sufficient to allow for leakage where such fault exists must be added to the execution of the algorithm 151. The hold period must be placed in between any two steps where the first step is a write operation of bit pattern x (or y) and the second step is read operation of the bit pattern x (or y, respectively). Since steps (5)–(6) and (7)–(8) satisfy these conditions, all F8-RFs will be manifested by such steps in the first execution of the base algorithm 150 used by the algorithm 151. FIG. 5 depicts such hold periods in between steps (5)–(6) and (7)–(8).

A F9-State Coupling Fault (F9-$CF_{st}$) occurs when the content of a coupled cell b is forced to a fixed value (either logic 0 or 1), only if the coupling cell a is in a fixed state (either logic 0 or 1). Four different combinations of fixed value and state are applicable to F9-$CF_{st}$, 0;0, 0;1, 1;0 and 1;1. F9-$CF_{st}$s can be detected when a write operation of bit pattern x (or y) is followed by a read operation of such bit pattern x (or y, respectively). Such read operation need not follow the write operation immediately, so long as there is no intermediate write operation of bit pattern y (or x, respectively). In steps (1)–(14), several steps meet this condition, namely, for bit pattern x, steps (1)–(2) and (5)–(6); and, for bit pattern y, steps (7)–(8) and (11)–(12); therefore, these steps may detect all F9-$CF_{st}$s However, as described above, F9-$CF_{st}$s involve faults in two memory cells or bits within a m-bit address (where m>1). In order to detect F9-$CF_{st}$s, steps (1)–(14) of the base algorithm 150 must be executed $\log_2 4+1$ or 3 times for a total of $14n*(\log_2 4+1)$ or 42n steps. Accordingly, the steps (15)–(28) and (29)–(42) which correspond to the F9-$CF_{st}$ detecting steps of (1)–(14) will also detect F9-$CF_{st}$s. The actual steps, either (1)–(14), (15)–(28) or (29)–(42), of the algorithm 151 which detect all F9-$CF_{st}$s depend on which execution of the base algorithm 150 used by the algorithm 151 applies the actual background pattern of the m-bit configuration. For example, if the background pattern corresponding to the m-bit configuration is the background pattern applied to steps (15)–(28), then all F9-$CF_{st}$s would be detected in the F9-$CF_{st}$ detecting steps of (15)–(28).

However, since the F8-RFs were already detected during the first execution of steps (1)–(14) of the base algorithm 150 used by the algorithm 151, hold periods are not needed in the remaining executions. Therefore, for the second and third executions as shown in FIG. 5, there are no hold periods.

The algorithms 152 and 153 detect the faults in each of their respective fault models in the same manner as the algorithm 151, since each of the algorithms 152 and 153 use the basic algorithm 150. Therefore, the detection of faults F1–F7 in each of the algorithms 152 and 153 will occur curing sequences (I)–(VI) or steps (1)–(14) in the same manner as they were detected for the algorithm 151.

As to fault F8-RF, such fault is detected by the algorithm 152 in the same manner as detected by the algorithm 151 in steps (1)–(14). Since such fault F8-RF is not detected by the algorithm 153, no hold periods are added to steps (1)–(14).

For F9-$CF_{st}$, as described above, the algorithm 150 is technology dependent. Therefore, such fault is detected in the same manner as for the algorithm 151 during only one execution of steps (1)–(14) used by the algorithm 150. Fault F9-$CF_{st}$ is not detected by either algorithm 152 or 153.

It is to be understood that while the present invention is shown to have detected the above-described faults, the basic algorithm 150 may detect additional faults which have not yet been analyzed with respect to the basic algorithm 150 or have not been identified as faults to date. The ability of the basic algorithm 150 to detect faults beyond those described herein is within the scope of the present invention.

Referring to FIG. 6, there is a representative embodiment according to the present invention in which the algorithm 151 is provided in pseudo-code for a synchronous (SYNC) RAM 50. The algorithm 151 of FIG. 6 is applied to a representative 4-bit memory addresses in a memory array 51 (FIG. 11) of the RAM 50. Accordingly, the algorithm 151 detects all F9-$CF_{st}$s by executing the base algorithm 150 $\log_2 4+1$ times or 3 times, for a total length of $14n*(\log_2 4+1)$ or 42n steps.

In FIG. 6, the line reference for each line of pseudo-code is in the first column. The operations are referenced in the second column (where the meanings of the terms R, W, ↔, →, ←, x, y are identical to those as in FIG. 2). The total number of steps required to complete the test per word in the memory array 51 for each line of the pseudo-code is referenced in the third column (where Word is the largest number of words in the memory array 51, and is equivalent to the value of n distinct addresses in the memory array 51).

In FIG. 6, line (A) is a Start signal to initiate the execution of the algorithm 151, which requires a single step. Lines (B)–(C), (E) and (G)–(I) contain steps (1)–(14) of the base algorithm 150 used by the algorithm 151. The application of the algorithm 151 requires that each step (1)–(14) be executed for each word in the memory array 51. Accordingly, for example, line (C) contains steps (2)–(5) or 4 steps for each word in the memory array 51. In addition, lines (D) and (F) contain the hold periods applicable to the detection by the algorithm 151 of F8-RFs. Lines (B)–(I) are executed for every word in the memory array 51. Upon completion of lines (B)–(I), the algorithm 151 has detected all faults F1–F8 and, where the bit pattern x corresponded to the m-bit configuration, all F9-$CF_{st}$s.

Upon completion of lines (B)–(I), line (J) is a Start Next signal to reinitiate the execution of steps (1)–(14) of the base algorithm 150, used by the algorithm 151 as steps (15)–(28), in lines (K)–(P) for the second bit patterns x and y necessary to test the memory array 51. Upon completion of lines (K)–(P) for each word in the memory array 51, if the bit pattern x corresponded to the m-bit configuration, the algorithm 151 has detected all F9-$CF_{st}$s.

After the final execution of line (P), line (Q) is another Start Next signal which reinitiates the execution of steps (1)–(14) of the base algorithm 150, used by the algorithm 151 as steps (29)–(42), for the third and final bit patterns x and y necessary to test the memory array 51. Upon completion of lines (R)–(W) as to each word in the memory array 51, the algorithm 151 has detected all F9-$CF_{st}$s because in this or a prior execution of steps (1)–(14) or (15)–(28), the bit pattern x corresponding to the m-bit configuration must have been applied. Thereafter, line (X) is executed using a working bit pattern Ly, in order to test that the components of the Output Data Comparator (ODC) 60 (FIG. 11) are operating properly. The ODC 60 receives the results from applying the algorithm 151 to the RAM 50 and compares such results to expected results for the purpose of identifying any faults in the RAM 50. The End signal is then asserted in line (Y) to indicate that the algorithm 151 has been completed.

The testing time, equal to the number of clock or test cycles to complete the algorithm 151 of FIG. 6, for the SYNC RAM 50 is calculated by the following formula:

$$\text{Number of clock cycles} = \text{ceiling\_of } (\log_2 m+1)*(14\text{Word}+1)+2n+2+2\text{HP}$$

where m, n, and Word are defined above and ceiling_of is the nearest integer greater than $\log_2 m+1$; and, HP is the holding period applied to the first execution of steps (1)–(14) of the algorithm 150 used by the algorithm 151. It should be noted that the length of the testing time is included in the formula. In addition, the value 14 is equivalent to the number of steps (1)–(14) of the base algorithm 150 which is used by the algorithm 151.

It should be noted that the algorithm 151 is equally applicable to an asynchronous (ASYNC) RAM 50. Referring to FIG. 7, there is another representative embodiment according to the present invention in which the algorithm 151 is provided in pseudo-code for an ASYNC RAM 50. The operations for each of lines (A)–(Y) are identical to the previously described lines (A)–(Y) for the SYNC RAM 50 shown in FIG. 6. The meanings of the variables in FIG. 7 are also identical to those of FIG. 6.

However, while the read/write operations for the ASYNC RAM 50 are identical to the SYNC RAM 50, testing the ASYNC RAM 50 requires additional processing operations (well known in the art). Accordingly, the total number of steps, including both read/write operations and processing operations, namely $27n*(\log_2 m+1)$ steps, is greater than that for the SYNC RAM 50, namely $14n*(\log_2 m+1)$ steps. Such processing characteristics, as well as the read and write operations (READ and WE, respectively), are referenced in the column containing comments. They include, for line (B): an ASU (asynchronous header) is applied before beginning any read or write operation; a WE (write operation); an AH (address hold) is applied at the end of any sequence of steps including at least one write operation.

In addition, for line (C), the ASU and WE were already described above. As to those steps which have not been previously described: a READ+DSU (a read operation with a data setup) is a data setup applied with a read operation where a write operation is performed immediately thereafter; a DH (data header) is applied after a write operation where there is a read operation immediately thereafter; READ+DSU was previously described; and, an AH+DH (an address hold faith a data header) is applied at the end of a sequence of steps including at least one each of read and write operations.

The steps in lines (E) and (G) were each already described above. In line (H), ASU and READ were already described above. In addition, in line (H), since a read operation ends the sequence, no DSU is needed. Each step in lines (I), (K)–(P) and (R)–(W) was previously described. Thereafter, line (X) is executed to test the functionality of the ODC 60 (FIG. 11) (as described above for step (X) in FIG. 6). The End signal is then asserted in line (Y) to indicate that the algorithm 151 of FIG. 7 has been completed.

The testing time to complete the algorithm 151 of FIG. 7 for the ASYNC RAM 50 is calculated as follows:

$$\text{Number of clock cycles} = \text{ceiling\_of } (\log_2 m+1)*(27\text{Word}+1)+3n+2+2\text{HP}.$$

The variables for this formula are identical to those for the SYNC RAM 50 clock cycle formula above. In addition, the value 27 is equivalent to the number of steps, or the number of operations performed for steps (1)–(14) of the base algorithm 150 used by the algorithm 151.

Referring to FIG. 8, there is another representative embodiment according to the present invention in which the algorithm 150 is provided in pseudo-code for the synchronous RAM 50. The operations (including terms) for each of lines (A)–(K) are identical to the previously described lines (A)–(K) for the SYNC RAM 50 shown in FIG. 6. In addition, all faults F1–F9 are detected upon completion of lines (B)–(I) for each word in the memory array 51 since only one execution of steps (1)–(14) of the algorithm 150 used by the algorithm 152 is needed to detect all such faults F1–F9. The testing time to complete the algorithm 152 of FIG. 8 for the SYNC RAM 50 is calculated by the following formula:

$$\text{Number of clock cycles} = (14\text{Word}+1)+2n+2+2\text{HP}$$

where m, n, Word and the value of 14 are identical to those in the formula for the algorithm 151 of FIG. 6.

Referring to FIG. 9, there is another additional representative embodiments according to the present invention in which the algorithm 152 is provided in pseudo-code for the synchronous RAM 50. The operations (including terms) for each of lines (A)–(K) are identical to the previously described lines (A)–(K) for the SYNC RAM 50 shown in FIG. 6. In addition, all faults F1–F8 are detected upon completion of lines (B)–(I) for each word in the memory array 51, since only one execution of steps (1)–(14) of the algorithm 150 used by the algorithm 153 is needed to detect all such faults F1–F9. The formula for the clock or test cycles to complete the algorithm 153 of FIG. 9 for the SYNC RAM 50 is also identical to such formula for the algorithm 150 of FIG. 8.

Referring to FIG. 10, there is another additional representative embodiments according to the present invention in which the algorithm 153 is provided in pseudo-code for the synchronous RAM 50. The operations (including terms) for each of lines (A)–(K) are identical to the previously described lines (B)–(C), (E) and (G)–(I) for the SYNC RAM 50 of FIG. 6. Omitted lines (D) and (F) from FIG. 6 correspond to the hold periods used by the algorithm 151 to detect F8-RFs. Since the algorithm 154 does not detect F8-RFs, such hold periods are not included in the pseudo-code presented in FIG. 10. The testing time to complete the algorithm 154 of FIG. 10 for the SYNC RAM 50 is calculated by the following formula:

$$\text{Number of clock cycles} = (14\text{Word}+1)+2n+2$$

where m, n, Word and the value of 14 are identical to those according to the formula for the algorithm 151 of FIG. 6. The 2HP variable in the formula is omitted because the algorithm 154 does not detect F8-RFs.

Referring to FIG. 11, there is a schematic block diagram illustrating a BIST hardware architecture for a single RAM array (RAM) (hereinafter BIST-RAM) 10. The BIST-RAM 10 comprises the following specialized blocks: a Regular Structure BIST Controller (RSB-CTL) 20, a Test Address Generator (TAG) 40, a Test Data Generator (TDG) 30, the Output Data Comparator (ODC) 60, a number of multiplexers (MUXs) 70, 80 and 90 and the RAM 50.

The RSB-CTL 20 activates and implements the algorithm 151 (shown in FIG. 6) or any of the other algorithms. The RSB-CTL 20 further controls the testing of the RAM 50 by controlling the input/output paths to the RAM 50 and sending control signals to each component of the RAM- BIST 10, namely a control signal 23 to the TAG 40, a control signal 22 to the TDG 30 and a control signal 25 to the ODC 60.

The TAG 40 provides address vectors and read/write operations to the RAM 50 under test. The TDG 30 generates the test vectors to be written into the RAM 50 under test in a predetermined sequence. The ODC 60 receives the output response from the RAM 50 and determines whether the algorithm 151 has identified any faults in the RAM 50. The MUXs 70, 80 and 90 are hardware elements that allow the test paths to and from the RAM 50 to be enabled while blocking each of the functional paths when the RAM 50 is under test.

Following receipt from a host processor 15 of a BISTRUN signal 21, the RSB-CTL 20 initiates testing of the RAM 50 by sending signals to the MUXs 70, 80 and 90, through the TDG 30 and TAG 40 for MUXs 70 and 80, respectively, to disable the functional input/output paths used for normal operation of the RAM 50 and enable the test paths to the RAM 50. The RSB-CTL 20 thereby assumes control of all the input/output paths of the RAM 50.

The functional input/output paths used for normal operation of the RAM 50 and which are disabled are a DATA IN path 71 to the MUX 70, a READ/WRITE ADDRESS path 81 to the MUX 80, a RAM control signal path 91 through MUX 90 and a DATA OUT path 52. The test i input/output paths used by the RSB-CTL 20 are a DATA IN path 31 to the MUX 70, a READ/WRITE ADDRESS path 41 to the MUX 80, a RSB-CTL signal path 24 through the MUX 90 and a DATA OUT path 53 from the RAM 50 to the ODC 60.

The RSB-CTL 20 then implements the algorithm 151 by determining the addresses and test vectors for the execution of the first sequence of operations of the algorithm 151 and instructing the TAG 40 and the TDG 30 to generate such addresses and test vectors through the control signals 23 and 22, respectively. The TAG 40 communicates such address vectors to through the READ/WRITE ADDRESS 41 to the MUX 80, and the MUX 80 then sends such address vectors to the memory array 51 through a READ/WRITE ADDRESS path 82. Similarly, the TDG 30 communicates such data vectors through the DATA IN path 31 to the MUX 70, and the MUX 70 then sends such data vectors to the memory array through a DATA IN path 72. The RSB-CTL 20 controls the RAM 50 under test using the RSB-CTL signal path 24L to the MUX 90; the MUX 90 then sends such controls from the RSB-CTL 20 to the RAM 50 through a second RSB-CTL signal path 92.

The RSB-CTL 20 then instructs the RAM 50 to execute the first sequence of operations of the algorithm 151 based on the addresses provided by the TAG 40 and the test vectors provided by the TDG 30. This process continues for each sequence of operations of the algorithm 151. The execution of the algorithm 151 according to this structure is well known in the art and therefore will not be further discussed herein.

When the algorithm 151 execution is completed, the RSB-CTL 20 instructs the RAM 50 to send an output response to the ODC 60 via the DATA OUT path 53. The RSB-CTL 20 then instructs the ODC 60 to compare the output response with the expected response and to generate a one bit signature, namely a BISTF signal 61, indicative of the operation of the RAM 50. The BISTF 61 will rise in the case of a mismatch between the actual response and the expected response, and will remain low while the responses match. At the completion of the algorithm 151, a logic 0 for the BISTF signal 61 indicates that the RAM 50 has passed the test, whereas for a logic 1 the BISTF signal 61 indicates failure.

Upon completion of the algorithm 151 test, the RSB-CTL 21 sends a BISTDONE signal 26, which signals to the host processor 15 the end of the test based on the algorithm 151. At this point, the host processor 15 may send a BISTFC signal 27 to the RSB-CTL 20. Upon receipt of the BISTFC signal 27, the RSB-CTL 20 may force the BISTF signal 61 to go to 1 in order to ensure that the BISTF signal 61 is not stuck at zero (0).

The present invention can be used for every type of RAM, including single or dual port, having synchronous or asynchronous memory arrays or a wide range of input control signals with positive or negative clocking. In addition, the present invention is a hierarchical approach that can be used at all levels of testing, i.e., not only when the chip is mounted on automatic test equipment, but also after the chip is mounted on a circuit board (board-level test), and when the board is installed in a system (system-level and field test). The test effectiveness of the present invention is the same at all of these levels. In addition, the present invention can be used for diagnostics and repair, in particular, when the test determines that certain cells are defective, the system can eliminate that cell, or the row or column it is in, from use as an active storage location.

Having thus described the present invention, it is to be understood that the above-described method and apparatus embodiments are illustrative of the principals of the present invention and that other methods and apparatus embodiments may be devised by those skilled in the art, without departing from the spirit and scope of the invention. In particular, while applicable specifically to RAMs, the invention may also be used to test other memory arrays and the invention is not to be considered limited by the specific examples illustrated herein, but by the appended claims.

We claim:

1. A method for detecting faults in a memory array having a plurality of addresses, comprising the steps of:
   (I) executing a first sequence of operations, comprising
      (1) a write operation of a first bit pattern to a memory location at a first of said plurality of addresses,
   (II) executing a second sequence of operations, comprising
      (2) a read operation of said first bit pattern from said memory location at said first address,
      (3) a write operation of a second bit pattern to said memory location at said first address, said second bit pattern being the complement of said first bit pattern,
      (4) a read operation of said second bit pattern from said memory location at said first address,
      (5) a write operation of said first bit pattern to said memory location at said first address,
   (III) executing a third sequence of operations after said second sequence, without the intervention of another operation, comprising
      (6) a read operation of said first bit pattern from said memory location at said first address,
      (7) a write operation of said second bit pattern to said memory location at said first address,
   (IV) executing a fourth sequence of operations after said third sequence, without the intervention of another operation, comprising
      (8) a read operation of said, second bit pattern from said memory location at said first address,
      (9) a write operation of said first bit pattern to said memory location at said first address,
      (10) a read operation of said first bit pattern from said memory location at said first address,
      (11) a write operation of said second bit pattern to said memory location at said first address, (V) executing a fifth sequence of operations, comprising
(12) a read operation of said second bit pattern from said memory location at said first address, and
(VI) executing a sixth sequence of operations, comprising
(13) a read operation of said second bit pattern from said memory location at said first address, and
(14) a write operation of said first bit pattern to memory location at said first address.

2. The method of claim 1 wherein
after each of said first through fifth sequences, said sequences are repeated for each said memory location at said plurality of addresses before executing the next sequence,
for each of said second through fourth sequences said repeat is in sequence from said first of said plurality of addresses to a last of said plurality of addresses, and
said sixth sequence is first executed for said last of said plurality of addresses and is repeated for each of said memory locations in sequence from said last of said plurality of addresses to said first of said plurality of addresses.

3. The method according to claim 2 wherein said first address of said plurality of addresses comprises the lowest order address in said memory array and said last address of said plurality of addresses comprises the highest order address in said plurality of addresses in said memory array.

4. The method according to claim 2 wherein said first address of said plurality of addresses comprises the highest order address in said memory array and said last address of said plurality of addresses comprises the lowest order address in said plurality of addresses in said memory array.

5. The method of claim 1 wherein
after each of said first through fifth sequences, said sequences are repeated for each said memory location at said plurality of addresses before executing the next sequence,
for each of said second and third sequences said repeat is in sequence from said first of said plurality of addresses to a last of said plurality of addresses,
for said fourth sequence said repeat is in sequence from said last of said plurality of addresses to said first of said plurality of addresses, and
said sixth sequence is first executed for said last of said plurality of addresses and is repeated for each of said memory locations in sequence from said last of said plurality of addresses to said first of said plurality of addresses.

6. The method according to claim 1 wherein said memory location comprises a memory cell in a RAM memory array.

7. The method according to claim 1 wherein said memory location comprises successive memory cells with a single memory address in a row of said memory array.

8. The method according to claim 1 wherein said memory location comprises a word with a single memory address in said memory array.

9. An method for detecting a plurality of faults comprising one of any of a stuck-open fault, a retention fault or a state coupling fault in a memory array having a plurality of addresses, comprising the steps of:
(I) executing a first sequence of operations, comprising,
(1) a write operation of a first bit pattern to a memory location at a first of said plurality of addresses,
(II) executing a second sequence of operations, comprising
(2) a read operation of said first bit pattern from said memory location at said first address,
(3) a write operation of a second bit pattern to said memory location at said first address, said second bit pattern being the complement of said first bit pattern,
(4) a read operation of said second bit pattern from said memory location at said first address,
(5) a write operation of said first bit pattern to said memory location at said first address,
(III) executing a third sequence of operations, comprising
(6) a read operation of said first bit pattern from said memory location at said first address,
(7) a write operation of said second bit pattern to said memory location at said first address,
(IV) executing a fourth sequence of operations, comprising
(8) a read operation of said second bit pattern from said memory location at said first address,
(9) a write operation of said first bit pattern to said memory location at said first address,
(10) a read operation of said first bit pattern from said memory location at said first address,
(11) a write operation of said second bit pattern to said memory location at said first address,
(V) executing a fifth sequence of operations, comprising
(12) a read operation of said second bit pattern from said memory location at said first address,
(VI) executing a sixth sequence of operations, comprising
(13) a read operation of said second bit pattern from said memory location at said first address,
(14) a write operation of said first bit pattern to said memory location at said first address, and
whereby said plurality of faults are detected.

10. The method of claim 9 wherein
after each of said first through fifth sequences, said sequences are repeated for each said memory location at said plurality of addresses before executing the next sequence,
for each of said second through fourth sequences said repeat is in sequence from said first of said plurality of addresses to a last of said plurality of addresses, and
said sixth sequence is first executed for said last of said plurality of addresses and is repeated for each of said memory locations in sequence from said last of said plurality of addresses to said first of said plurality of addresses.

11. The method according to claim 10 wherein said first address of said plurality of addresses comprises the lowest order address in said memory array and said last address of said plurality of addresses comprises the highest order address in said plurality of addresses in said memory array.

12. The method according to claim 10 wherein said first address of said plurality of addresses comprises the highest order address in said memory array and said last address of said plurality of addresses comprises the lowest order address in said plurality of addresses in said memory array.

13. The method according to claim 9 wherein said memory location comprises a memory cell in a RAM memory array.

14. The method according to claim 9 wherein said memory location comprises successive memory cells with a single memory address in a row of said memory array.

15. The method according to claim 9 wherein said memory location comprises a word with a single memory address in said memory array.

16. An apparatus for a detecting faults in a memory array having a plurality of addresses, comprising:
(I) means for executing a first sequence of operations, comprising,
(1) a write operation of a first bit pattern to a memory location at a first of said plurality of addresses,
(II) means for executing a second sequence of operations, comprising (2) a read operation of said first bit pattern from said memory location at said first address,
(3) a write operation of a second bit pattern to said memory location at said first address, said second bit pattern being the complement of said first bit pattern,
(4) a read operation of said second bit pattern from said memory location at said first address,
(5) a write operation of said first bit pattern to said memory location at said first address,
(III) means for executing a third sequence of operations after said second sequence, without the intervention of another operation, comprising
(6) a read operation of said first bit pattern from said memory location at said first address,
(7) a write operation of said second bit pattern to said memory location at said first address,
(IV) means for executing a fourth sequence of operations after said third sequence, without the intervention of another operation, comprising
(8) a read operation of said second bit pattern from said memory location at said first address,
(9) a write operation of said first bit pattern to said memory location a said first address,
(10) a read operation of said first bit pattern from said memory location at said first address,
(11) a write operation of said second bit pattern to said memory location at said first address,
(V) means for executing a fifth sequence of operations, comprising
(12) a read operation of said second bit pattern from said memory location at said first address, and
(VI) means for executing a sixth sequence of operations, comprising
(13) a read operation of said second bit pattern from said memory location at said first address, and
(14) a write operation of said first bit pattern to said memory location at said first address.

17. The apparatus of claim 16 further including
means for repeating said first through fifth sequences, after each of said first through fourth sequences, for each said memory location at said plurality of addresses, before executing the next sequence, said means for repeating causes each of said second through fourth sequences to repeat in sequence from said first of said plurality of addresses to a last of said plurality of addresses, and
said means for executing said sixth sequence further comprises means for first executing said sixth sequence for said last of said plurality of addresses and means for repeating said sixth sequence for each of said memory locations in sequence from said last of said plurality of addresses to said first of said plurality of addresses.

18. The apparatus according to claim 17 wherein said first address of said plurality of addresses comprises the lowest order address in said memory array and said last address of said plurality of addresses comprises the highest order address in said plurality of addresses in said memory array.

19. The apparatus according to claim 17 wherein said first address of said plurality of addresses comprises the highest order address in said memory array and said last address of said plurality of addresses comprises the lowest order address in said plurality of addresses in said memory array.

20. The apparatus according to claim 16 wherein said memory location comprises a memory cell in a RAM memory array.

21. The apparatus according to claim 16 wherein said memory location comprises successive memory cells with a single memory address in a row of said memory array.

22. The apparatus according to claim 16 wherein said memory location comprises a word with a single memory address in said memory array.

23. An apparatus for a detecting faults in a memory device comprising a memory array having a plurality of addresses, comprising:
a BIST controller coupled to said memory device,
a CPU coupled to said BIST controller, said CPU enabling execution by said BIST controller of a March algorithm to detect faults comprising one of a stuck-open fault, a retention fault or a state coupling fault in said memory array,
a test address generator and a test data generator, each coupled to said memory device,
upon receiving an enabling signal from said CPU, said BIST controller further generating a control signal for said test address generator to generate test vectors to be written into said memory array in a predetermined sequence, said BIST further generating a control signal for said test data generator to provide address vectors and read/write operations to said memory device, and
said BIST controller further executing said March algorithm according to $\leftrightarrow(W^x)$;
$\rightarrow(R^x,W^y,R^y,W^x)$;
$\rightarrow(R^x,W^y)$;
$\rightarrow(R^y,W^x,R^x,W^y)$;
$\leftrightarrow(R^y)$;
$\leftarrow(R^y,W^x)$ wherein $\leftrightarrow$ indicates a first sequence of memory addresses where the order is immaterial, $\rightarrow$ indicates a second sequence of memory addresses from a first of said plurality of addresses to a last of said plurality of addresses, $\leftarrow$ indicates a third sequence of memory addresses, said third sequence being the complement of said second sequence of memory addresses, $W^x$ indicates a write operation of a first bit pattern x, $W^y$ indicates a write operation of a second bit pattern y, said second bit pattern y being the complement of said first bit pattern x, $R^x$ indicates a read operation of said first bit pattern x and $R^y$ indicates a read operation of said second bit pattern y.

24. The apparatus of claim 23 wherein said first sequence comprises said second sequence.

25. The apparatus of claim 23 wherein said first sequence comprises said third sequence.

26. The apparatus of claim 23 wherein said first address of said plurality of addresses comprises the lowest order address in said memory array and said last address of said plurality of addresses comprises the highest order address in said plurality of addresses in said memory array.

27. The apparatus according to claim 23 wherein said first address of said plurality of addresses comprises the highest order address in said memory array and said last address of said plurality of addresses comprises the lowest order address in said plurality of addresses in said memory array.

28. The apparatus according to claim 23 wherein
an output data comparator is coupled to said BIST controller, and
wherein upon completion of execution of said March algorithm, said BIST controller further generates a control signal for said memory device to send an output response to said output data comparator, said BIST controller further generating a control signal for said output data comparator to compare said output response to an expected response and to generate a signal indicative of a fault status of said memory device when said output response is different from said expected response.

29. An apparatus for a detecting faults in a memory device comprising a memory array having a plurality of addresses, comprising:
 a BIST controller coupled to said memory device,
 a CPU coupled to said BIST controller, said CPU enabling execution by said BIST controller of a March algorithm to detect faults comprising one of a stuck-open fault, a retention fault or a state coupling fault in said memory array,
 a test address generator and a test data generator, each coupled to said memory device,
 upon receiving an enabling signal from said CPU, said BIST controller further generating a control signal for said test address generator to generate test vectors to be written into said memory array in a predetermined sequence, said BIST further generating a control signal for said test data generator to provide address vectors and read/write operations to said memory device, and
 said BIST controller further executing said March algorithm according to
 $\leftrightarrow(W^x)$;
 $\rightarrow(R^x,W^y,R^y,W^x)$;
 $\rightarrow(R^x,W^y)$;
 $\leftarrow(R^y,W^x,R^x,W^y)$;
 $\leftrightarrow(R^y)$;
 $\leftarrow(R^y,W^x)$;
wherein $\leftrightarrow$ indicates a first sequence of memory addresses where the order is immaterial, $\rightarrow$ indicates a second sequence of memory addresses from a first of said plurality of addresses to a last of said plurality of addresses, $\leftarrow$ indicates a third sequence of memory addresses, said third sequence being the complement of said second sequence of memory addresses, $W^x$ indicates a write operation of a first bit pattern x, $W^y$ indicates a write operation of a second bit pattern y, said second bit pattern y being the complement of said first bit pattern x, $R^x$ indicates a read operation of said first bit pattern x and $R^y$ indicates a read operation of said second bit pattern y.

30. A method for a detecting faults in a memory array having a plurality of addresses, comprising the steps of:
 (I) executing a first sequence of operations, comprising
  (1) a write operation of one of a plurality of bit patterns to a memory location at a first of said plurality of addresses,
 (II) executing a second sequence of operations, comprising
  (2) a read operation of said one of said plurality of bit patterns from said memory location at said first address,
  (3) a write operation of a second bit pattern to said memory location at said first address, said second bit pattern being the complement of said one of said plurality of bit patterns,
  (4) a read operation of said second bit pattern from said memory location at said first address,
  (5) a write operation of said one of said plurality of bit patterns to said memory location to said first address,
 (III) executing a third sequence of operations after said second sequence, without the intervention of another operation, comprising
  (6) a read operation of said one of said plurality of bit patterns from said memory location at said first address,
  (7) a write operation of said second bit pattern to said memory location at said first address,
 (IV) executing a fourth sequence of operations after said second sequence, without the intervention of another operation, comprising
  (8) a read operation of said second bit pattern from said memory location at said first address,
  (9) a write operation of said one of said plurality of bit patterns to said memory location at said first address,
  (10) a read operation of said one of said plurality of bit patterns from said memory location at said first address,
  (11) a write operation of said second bit pattern to said memory location at said first address,
 (V) executing a fifth sequence of operations, comprising
  (12) a read operation of said second bit pattern from said memory location at said first address, and
 (VI) executing a sixth sequence of operations, comprising
  (13) a read operation of said second bit pattern from said memory location at said first address, and
  (14) a write operation of said one of said plurality of bit patterns to said memory location at said first address.

31. The method of claim 30 wherein said plurality of bit patterns comprises n number of bit patterns, said n number being calculated according to the smallest integer value which is greater than $\log_2 m+1$ where m is the number of bits in said memory location.

32. The method of claim 31 wherein further comprising the steps of:
 executing a first through sixth sequence loop comprising
  (a) after each of said first through fifth sequences, said sequence is repeated for each said memory location at said plurality of addresses before executing the next sequence,
  (b) for each of said second through fourth sequences said repeat is in sequence from said first of said plurality of addresses to a last of said plurality of addresses, and
  (c) said sixth sequence is first executed for said last of said plurality of addresses and is repeated for each of said memory locations in sequence from said last of said plurality of addresses to said first of said plurality of addresses,
 and wherein upon completion of the last execution of said sixth sequence for said first of said plurality of addresses, said first through sixth sequence loop is repeated n−1 times using said n number, and for each of said n number repetitions, said one of said plurality of bit patterns is different from said one of said plurality of bit patterns used in any preceding repetition of said first through sixth sequence loop.

33. The method according to claim 32 wherein said first address of said plurality of addresses comprises the lowest order address in said memory array and said last address of said plurality of addresses comprises the highest order address in said plurality of addresses in said memory array.

34. The method according to claim 32 wherein said first address of said plurality of addresses comprises the highest order address in said memory array and said last address of said plurality of addresses comprises the lowest order address in said plurality of addresses in said memory array.

35. The method according to claim 30 wherein said memory location comprises a memory cell in a RAM memory array.

36. The method according to claim 30 wherein said memory location comprises successive memory cells with a single memory address in a row of said memory array.

37. The method according to claim 30 wherein said memory location comprises a word with a single memory address in said memory array.

* * * * *